United States Patent

Moore et al.

[11] Patent Number: 5,763,782
[45] Date of Patent: Jun. 9, 1998

[54] MICROMECHANICAL SENSOR

[75] Inventors: David Frank Moore, Cambridge; Andrew Charles Frederick Hoole, Trumpington; Alan Heaver, Oakington, all of England

[73] Assignee: British Technology Group Limited, London, England

[21] Appl. No.: 794,488

[22] Filed: Feb. 4, 1997

Related U.S. Application Data

[63] Continuation of Ser. No. 302,842, Dec. 26, 1994, abandoned.

[30] Foreign Application Priority Data

Mar. 16, 1992 [GB] United Kingdom ............... 9205711

[51] Int. Cl.⁶ ............... G01P 15/125; G01R 33/02; G01N 27/12
[52] U.S. Cl. ............... 73/514.18; 73/31.06; 73/514.21; 324/207.13
[58] Field of Search ............... 73/497, 514.16, 73/514.18, 514.21, 514.32, 514.36, 31.05, 31.06, 862.61, 862.625, 632.626; 324/207.13; 361/278, 280, 283.2; 310/309

[56] References Cited

U.S. PATENT DOCUMENTS

| | | | |
|---|---|---|---|
| 3,335,338 | 8/1967 | Lepselter | 317/234 |
| 4,091,680 | 5/1978 | Block | 73/514.32 |
| 4,653,326 | 3/1987 | Danel et al. | 73/517 R |
| 4,668,865 | 5/1987 | Gimzewski et al. | |
| 4,674,319 | 6/1987 | Muller et al. | |
| 4,783,237 | 11/1988 | Aine | 437/15 |
| 4,806,755 | 2/1989 | Duerig et al. | |
| 4,906,840 | 3/1990 | Zdeblick et al. | |
| 4,912,822 | 4/1990 | Zdeblick et al. | |
| 4,920,800 | 5/1990 | Boura | 73/517 R |
| 4,953,387 | 9/1990 | Johnson et al. | 73/25.03 |
| 5,025,346 | 6/1991 | Tang et al. | 73/DIG. 1 |
| 5,116,462 | 5/1992 | Bartha et al. | |

FOREIGN PATENT DOCUMENTS

| | | |
|---|---|---|
| 0149572 | 7/1985 | European Pat. Off. . |
| 413042 | 2/1991 | European Pat. Off. . |
| 9203740 | 3/1992 | WIPO . |

OTHER PUBLICATIONS

D.F. Moore et al "Microfabrication of freestanding microstructures", Microcircuit Engineering Journal (1993). M.I. Lutwyche and D.F. Moore, Suspended Structures made by electron beam lithography, Micromech. Microeng. 1 (1991) pp. 237–246.

Roger T. Howe et al, "Silicon micromechanics: sensors and actuators on a chip", IEEE Spectrum, Jul. 1990, pp. 29–35.

A.P. Pisano, "Resonant-structure Micromotors Historical Perspective and Analysis", Sensor and Actuators, 20 (1989) pp. 83–89.

(List continued on next page.)

*Primary Examiner*—John E. Chapman
*Attorney, Agent, or Firm*—Cushman Darby & Cushman Intellectual Property Group of Pillsbury Madison & Sutro, LLP

[57] ABSTRACT

A micromechanical sensor has a plurality of sensing elements (14a–14d) which are supported at respective support regions (12a–12d). A first set of the sensing elements defines the sensing gap. In one arrangement this is defined by sensing elements supported by adjacent support regions. In another embodiment the sensing gap is defined between one sensing element and a reference beam formed by connection of the return legs of two diametrically opposed sensing elements. The sensing elements are substantially similar one to another and each sensing element comprises an outgoing elongate leg extending away from its associated support region and a return leg substantially parallel to the outgoing leg extending towards the support region. By providing sensing elements which are substantially similar in shape and arranged in this way, the effects of thin film stress are minimized.

10 Claims, 3 Drawing Sheets

OTHER PUBLICATIONS

U. Dibbern, "A Substrate for Thin–film Gas Sensor in Microelectronic Technology", Sensor and Actuators B, 2 (1990) pp. 63–70.

D.F. Moore et al, "Microfabrication of Freestanding Structures", Microcircuit Engineering 92 Erlangen Sep. 21–24 1992.

Applied Physics Letters, vol. 58, No. 7, Jan. 1991, New York US pp. 100–102 T. W. Kenny et al "Micromachined silicon tunnel sensor for motion detection".

Journal of Vacuum Science and Technology: Part vol. 8, No. 4, Jul. 1990, New York US, pp. 3606–3613 D.W. Burns; H.Guckel "Thin films for micromechanical sensors".

Journal of Micromechanical Engineering vol. 1, pp. 113–125 G. Stem "Resonant silicon sensors".

Journal of Microscopy vol. 152, No. 2 Nov. 1988, pp. 585–596, C.Schneiket et al "scanning tunneling engineering et al" Scanning tunneling engineering.

MICROMECHANICAL SENSOR

This is a continuation of application Ser. No. 08/302,842, filed on Dec. 26, 1994, which was abandoned upon the filing hereof.

The present invention relates to a micromechanical sensor, and particularly to an electromicromechanical sensor.

There exist several fabrication techniques specifically for manufacturing micromechanical structures. These techniques fall broadly into two categories: bulk micromachining and surface micromachining. Bulk micromachining involves sculpting a silicon substrate by means of chemical etchants whilst surface micromachining involves the use of deposition of thin films on a silicon substrate.

Bulk micromachining is a proven high volume production technique used to fabricate structures with precisely determined critical dimensions. However, surface-micromachined sensors have the advantage of being significantly smaller than bulk-micromachined sensors. Since film thicknesses on the surface of a silicon wafer can be as many as 100 times smaller than the thickness of a wafer itself, surface-micromachined parts can be an order of magnitude smaller than bulk-micro-machined parts. Futhermore, surface-micromachining techniques which involve the deposition and etching of films are more compatible with conventional integrated circuit manufacture processes.

Surface micromachining has been used to manufacture an accelerometer which is described in the technology-section of Electronic World News of 9th Sept. 1991. There have also been attempts to make sensors comprising free-standing micro structures, such as beams, which can be deflected electrostatically towards and away from other parts of the micro structure so as to control the size of a gap.

There is currently a desire to integrate sensors onto silicon integrated circuit chips to reduce fabrication costs, increase the reliability and to miniaturize the sensors as far as possible.

The current proposals for surface-micromachined sensors all suffer from a common difficulty and that is the existence of stresses which arise in the thin films which constitute the suspended elements of the micro structures. These stresses can cause suspended elements of the micro structure to bend and twist out of the plane in which the gap is defined. This has at least two disadvantages. In the first place, there is no longer control over the size of the gap since it could now have a dimension outside the plane within which it was originally defined. In the second place, where the sensing relies on the contact of the suspended element with another part of the micro-structure, this contact may in fact not take place if the element twists so that it is moving in a plane outside that of the other part of the micro-structure.

The present invention seeks to overcome these difficulties.

According to the present invention there is provided a micromechanical sensor comprising a plurality of sensing elements supported on a substrate at respective support regions, a first set of said sensing elements having respective sensing portions and arranged to define a sensing gap and a second set of said sensing elements forming a counterpart set, the sensing elements being substantially similar one to another, and each sensing element comprising an outgoing elongate leg extending away from its associated support region and a return leg substantially parallel to the outgoing leg extending towards the support region.

It is particularly advantageous if the support regions are arranged in close proximity to one another and to the sensing gap. Preferably the distance between the sensing gap and the support regions, and between the support regions, is less than the length of each sensing element, preferably substantially less. The support regions are preferably arranged symmetrically.

As the sensing elements in the counterpart sets are substantially similar in shape to the sensing elements defining the sensing gap, when the counterpart set are subject to forces intended to cause movement of the sensing elements any twisting or bending effects of stress affect both the counterpart set and the sensing set equally so that the effect on the sensing action itself is minimized.

In one embodiment, the first set of sensing elements comprises sensing elements supported by adjacent support regions, the return leg of each sensing element terminating in its sensing portion and the sensing portions defining between them the sensing gap. The second set of sensing elements likewise comprises sensing elements supported by adjacent support regions, the support regions supporting the sensing elements of the second set being arranged opposite the support regions supporting the sensing elements of the first set. In this embodiment, one of the second set of sensing elements acts as a control element to attract one of the first set and thereby close the sensing gap.

In another embodiment, the first set of sensing elements comprises sensing elements supported by support regions diametrically opposed with respect to one another, the free ends of the return legs of these sensing elements carrying the sensing portions. The counterpart sensing elements are supported by respective support regions also arranged diametrically opposed to one another and perpendicularly with respect to the support regions supporting the sensing elements of the first set. The return legs of the sensing elements of the counterpart set are connected to form a suspended beam, which acts as a reference element. Each sensing portion defines with the beam a sensing gap. A sensor according to this embodiment can be excited magnetically.

Each leg of each sensing element can include a stepped region, the stepped regions being arranged so as to maintain the symmetry of the sensor. The stepped region lies in the plane of the sensing element. Such portions are advantageous where the sensor is formed by a method involving the etching of a silicon substrate. Such etching occurs preferentially where there are convex corners and the provision of stepped portions provides more convex corners at which the undercutting preferentially occurs.

Preferably, each sensing element comprises an insulating layer and a conductive layer over the insulating layer. The insulating layer can be for example silicon nitride and the conductive layer can be for example a metal such as gold.

The sensing portions of the sensor can be provided with additional sensing layers particular to an analyte to be sensed.

For a better understanding of the present invention, and to show how the same may be carried into effect, reference will now be made, by way of example, to the accompanying drawings in which.

Figure 1:
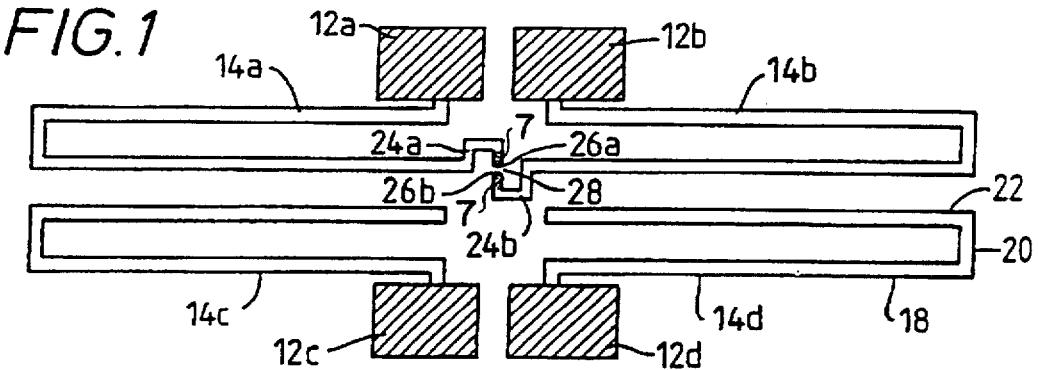
FIG. 1 is a diagrammatic plan view illustrating the principles underlying the sensor.

FIG. 1 shows the principles on which the sensor is based. There are four support regions 12a,12b,12c,12d which are arranged symmetrically with respect to one another and are physically close to one another. Each support region supports a respective suspended element 14a,14b,14c,14d. The supported regions and elements are electrically isolated from one another. Each suspended element is substantially in the form of an elongate U, that is with one leg 18 extending away from the support region 12, a relatively short base 20 and a return leg 22 extending back towards a central region of the sensor between the support regions. The return leg 22 is substantially parallel to the outgoing leg 18. The suspended elements are formed in two sets. The first set 14a,14b are referred to herein as the sensing set. Each element 14a,14b of the sensing set has at the end of its return leg 22 a sensing portion 24. The sensing portions 24a,24b terminate in sensing tips 26a,26b which define a sensing gap 28. This gap provides the measurement facility of the sensor as described in more detail hereinafter. The gap can be of the order of 1μm or smaller, limited only by processing technology.

Figure 2:
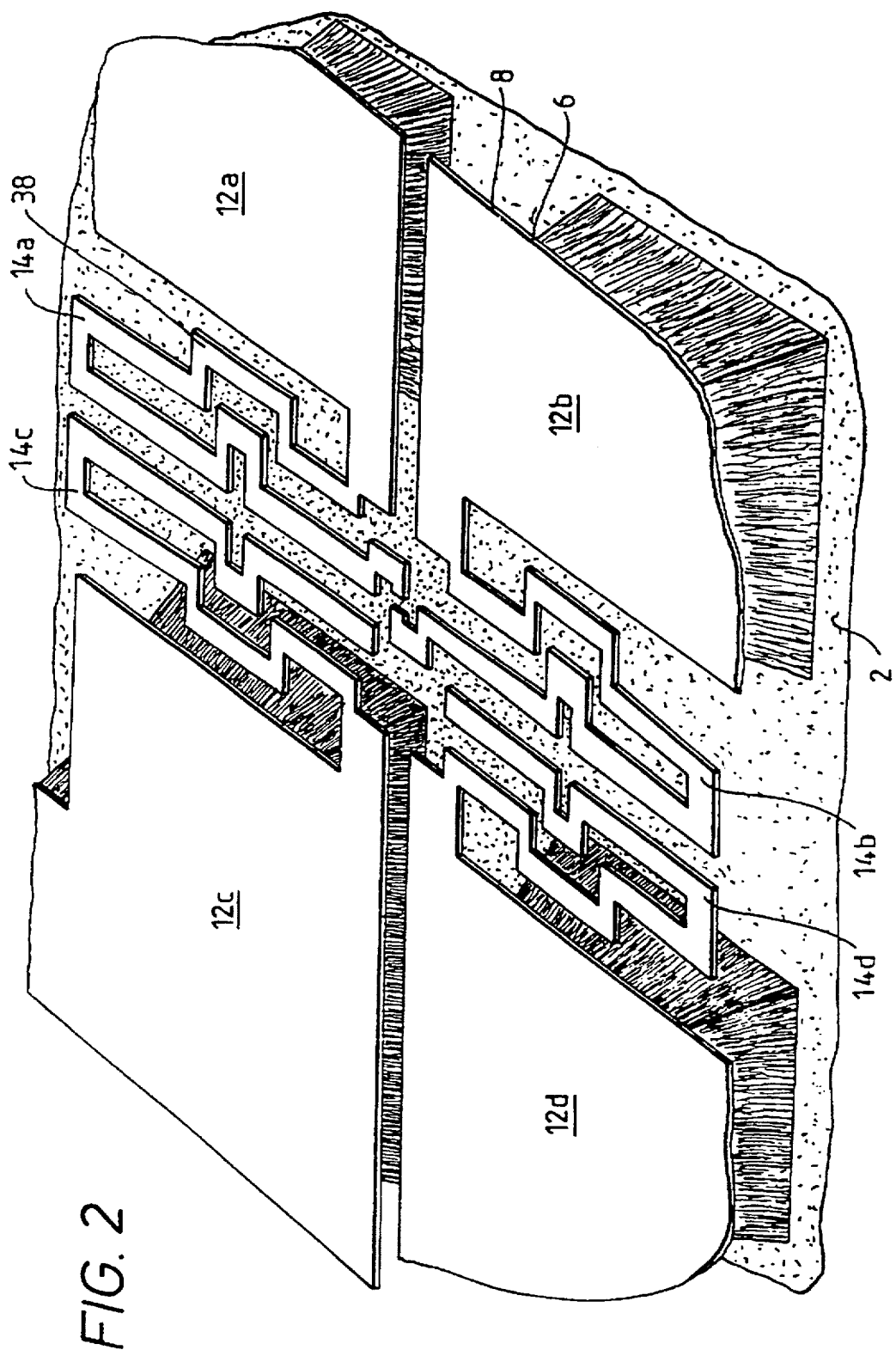
FIG. 2 is a perspective view of a sensor in accordance with one embodiment of the present invention.

The other set of sensing elements 14c,14d constitutes a counterpart set which is substantially symmetrical with the previous set. It is an important aspect of the present invention that there is symmetry between the suspended elements. This maintains alignment of the sensing elements of the sensing set and the counterpart set when movement of the elements occurs during sensing. In addition, any acceleration forces affecting the chip affect all elements approximately equally so the gap width is largely unaffected. The importance of this feature is discussed further later in relation to operation of the sensor. In the embodiment of FIGS. 1 and 2, the ends of the return legs 22 of the elements 14c,14d are left free.

Another important feature of the described embodiment is the provision of the four support regions 12a,12b,12c,12d spaced physically close one to another. The distance between the suspended elements is thus kept to a minimum to enable the potential difference required to create a desired electrical field to be kept to a minimum. This minimizes the effect of thin film stresses in the suspended elements 14a, 14b,14c,14d. These support regions also provide electrical contacts of the sensor to which a voltage can be applied during operation of the sensor. It is also important to maintain the support regions close to the sensing gap relative to the length of each element as shown in FIG. 1, again to minimize the effect of thin film stresses.

Compensation for thin film stresses is also provided by the elongate U structure of the sensing elements, the legs of which permit stresses to be accommodated in a direction perpendicular to that in which sensing takes place. Thus, the effects of stresses in the thin film which constitutes these suspended elements have a negligible effect on the sensing portions and the gap defined therebetween. Any effects arising from this film stress is nullified by the symmetry of the sensor and all the elements will be similarly affected.

FIG. 2 shows another embodiment of the invention, in a perspective view. FIG. 2 shows a silicon substrate 2 which provides the support regions 12a–12d for the suspended elements 14a–14d of the sensor. Each element comprises a layer 6 of an insulator such as silicon nitride and a layer 8 of a metal such as gold. These layers also define the electrical contacts.

There will now be described a method of manufacture of the sensor, with reference to FIGS. 4 to 8.

Figure 4:
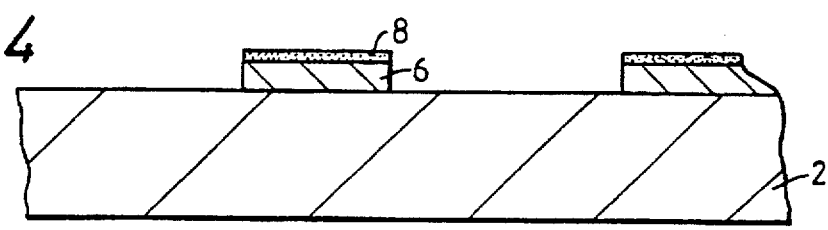
FIGS. 4 and 5 are sections through the sensor at different stages of its manufacture.
Figure 5:
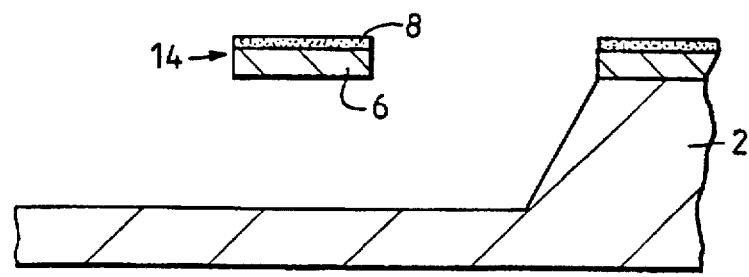

There is deposited on a (100) oriented silicon substrate 2 a layer 6 of an insulating material such as silicon nitride to a thickness of about 1 micron. In another embodiment a sacrificial layer such as silicon oxide may be deposited before the silicon nitride. There is then deposited over the insulating layer 6 a thin film of a conductive material such as gold. Alternatively the conductor may be deposited after making the suspending microstructure. Standard optical lithography is then used to pattern the wafer with the elements of the sensor aligned in the (110) direction. A mask is put down as shown by the shaded portions in FIGS. 6 to 8 which illustrate diagrammatically the shape of the mask for a counterpart sensing element of FIG. 1. Preferably all corners are rounded to improve the mechanical properties of the suspended sections. The mask is used to etch the conductive layer in an etch of for example potassium iodide in iodine and water. The insulating layer is then etched for example using a plasma etch in carbon-tetra-fluoride and oxygen. Then, the silicon substrate or the sacrificial layer if there is one is etched. Where it is the silicon substrate which is to be etched, the etch is carried out for example using potassium hydroxide and water which etches silicon but not silicon nitride or gold. The etch can be taken for example to a depth of 20 microns. Where a silicon dioxide sacrificial layer is used, a buffered hydrofluoric acid etch is used for this step. FIG. 4 shows a section through the substrate after the conductive and insulating layers have been etched and FIG. 5 shows a section through the substrate after the final etch. In particular, FIG. 5 shows a suspended element 14.

Figure 6:
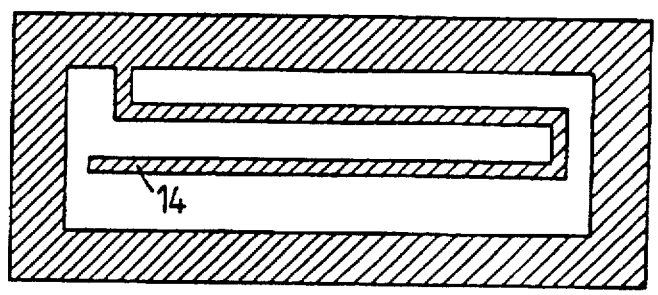
FIGS. 6 to 8 are plan views of a part of the sensor during steps in its manufacture.
Figure 7:
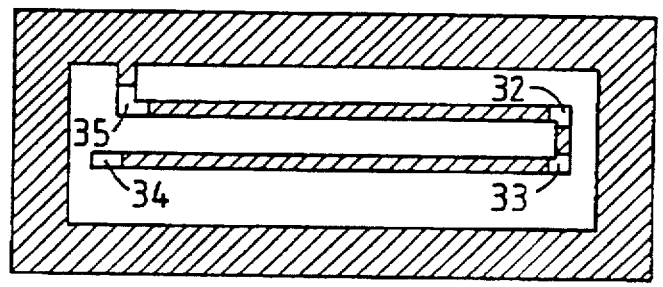
Figure 8:
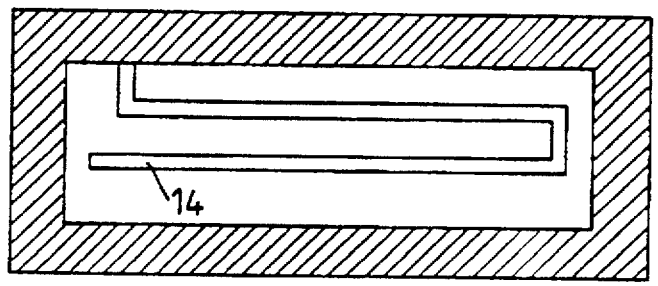

FIGS. 6 to 8 demonstrate how the final etch proceeds in the case of silicon. Etching proceeds preferentially where there are convex corners as identified by reference numerals 32 through 35 in FIG. 7. FIG. 2 shows a stepped portion indicated by way of example by reference numeral 38 in the legs of the sensing elements 14. These stepped portions provide additional convex regions where the etch will occur preferentially so that the etch process is speeded up. It also reduces the depth required to etch into the wafer. These stepped regions are not necessary where a sacrificial layer of oxide is used.

The sensor can be used in several different modes of operation. One example is the electrostatic mode.

A small potential difference (of the order of 1 V) is maintained between contacts 12a and 12b. If a large potential difference (of the order of 20 V) is applied between contacts 12a and 12c, there is an electric field resulting in an electrostatic attraction between the sensing elements 14a and 14c. As a result, the element 14a tends to move towards the element 14c and element 14c moves a similar distance towards element 14a by virtue of the symmetry of the sensor. Elements 14b and 14d do not move. The result is that the sensing tip 26a moves to reduce the gap between that tip and the tip 26b of the stationary element. For some sensing modes, the gap can be closed altogether. For stable operation, the width of the gap is set to be less than half the separation between elements 14a and 14c when there is no potential difference between contact regions 12a and 12c. For some applications the potential difference between the contacts 12a and 12c can be controlled so that sensing element 14a is not actually brought into contact with sensing element 14c.

The electrostatic mode of operation can for some applications be used by applying a potential difference between the contacts 12b and 12d. Sensing elements 14b and 14d then operate as described in relation to the sensing elements 14a and 14c, but in this case tip 26b moves to increase the gap between the tip and the tip 26a of the stationary element.

An output from the sensor can then be derived in dependence on the electrical properties while the gap is closed. For example, the current flowing for a given applied test potential difference between 12a and 12b may be measured by circuitry connected to the contacts and implemented on the same silicon wafer. The test potential difference between 14a and 14b is much smaller than the potential differences between 14a and 14c or 14b and 14d, and thus does not result in significant movements of the suspended microstructures. In another embodiment, where the sensing tips 26a,26b carry a dielectric medium, a capacitor is formed between the sensing tips when the gap is closed. This capacitance may be measured. In yet another embodiment, a.c. excitation of the sensing elements may be used to measure resonance properties, for example make integrated resonators in place of the quartz crystals presently used in watches, etc.

These and other modes of operating silicon sensors are described for example in "Resonant Silicon Sensors" published in Micromech. Microeng. 1 (1991) 113–125.

In a still further embodiment, the gap 28 need not be entirely closed but merely closed to within a distance across which a tunnelling current will flow between the sensing tips 26a,26b. An example of the use of the tunnelling effect in a sensor is described in an article entitled "Fabrication of a Tunnel Sensor with Cantilever Structure" published in the Technical Digest of IVMC 19, Nagahama 1991, pages 204 and 205, and in an article entitled "An electron tunnelling sensor" by S. B. Waltman and W. J. Kaiser, published in Sensors and Actuators 19(1989) 201–210.

When used as a tunnel sensor, the sensor of the present invention has an advantage over known tunnel sensors in that it can be manufactured on a single chip using technologies compatible with CMOS and other integrated circuit processes. Existing forms of tunnel junction devices use hybrid technology and involve two or more chips which must be bonded together. The problems arising from thin film stresses have so far prevented the development of integrated single chip tunnel sensors. As explained above, the effect of thin film stresses are substantially ameliorated by the configuration of the sensor described herein.

The sensor can be used as a gas sensor or pollutant sensor if the sensing portions 24a,24b of the suspended elements 14a,14b are coated with a layer 7 of a substance appropriate to the analyte to be detected. The sensor of the present invention lends itself readily to coating with suitable layers by evaporation after it has been fabricated. In known sensors, the sensing gap is often formed between a point structure in a lower plane and a continuous structure in an upper plane. It is then necessary to coat the underside of the upper structure, which can be awkward. When the sensor is used in this way, the gap can be left open during exposure to the gas and then closed electrostatically (by applying a voltage between 12a and 12c) when a readout is required. The absorption of the gas onto the film deposited on the sensing portions changes the resistive, capacitive or other electric properties measured at the contacts using a test potential between 12a and 12b as described above. After a reading has been taken, the gap can then be reopened for a further sensing period.

Figure 3:
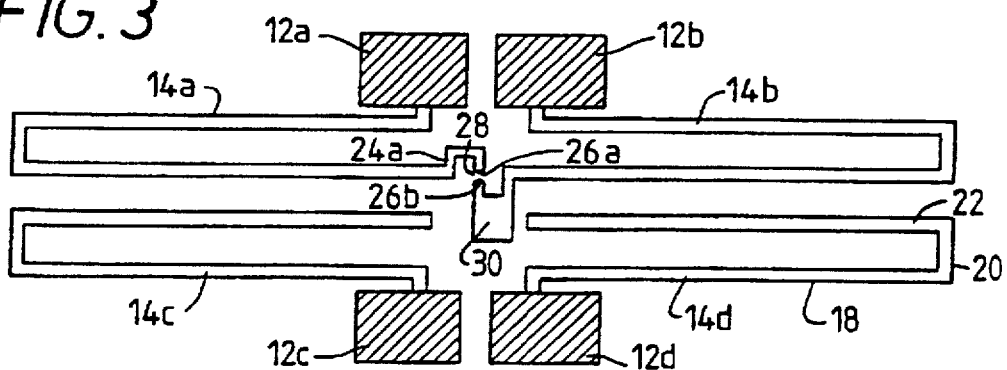
FIG. 3 is a diagrammatic plan view of the sensor modified for use as an accelerometer.

FIG. 3 shows a modified embodiment of the present invention which can be used as an accelerometer. In this embodiment, the sensor is formed in substantially the same way as described with reference to FIGS. 1 and 2 but a mass 30 is added to the sensing portion 24b of the sensing element 12b. The mass 30 is simply an extra piece of the materials of the suspended element in which case the fabrication process is the same as the method of manufacture described above in relation to FIGS. 4 to 8. If the substrate undergoes an acceleration downwards in FIG. 3, the mass 30 is subject to a force which causes the gap 28 to decrease in size and the tunnel current is increased exponentially with the gap width. In order to obtain a measurement, a voltage can be applied to the contact 12d to create an electrostatic attraction pulling the element 14b towards the element 14d so as to maintain the gap at a constant size. The readout from the sensor is then the voltage applied to the contact, this voltage being directly proportional to the acceleration. The component of acceleration in the direction to the left in FIG. 3 could be detected by a similar sensor oriented at 90° with respect to that in FIG. 3, and manufactured on the same substrate.

Figure 9:
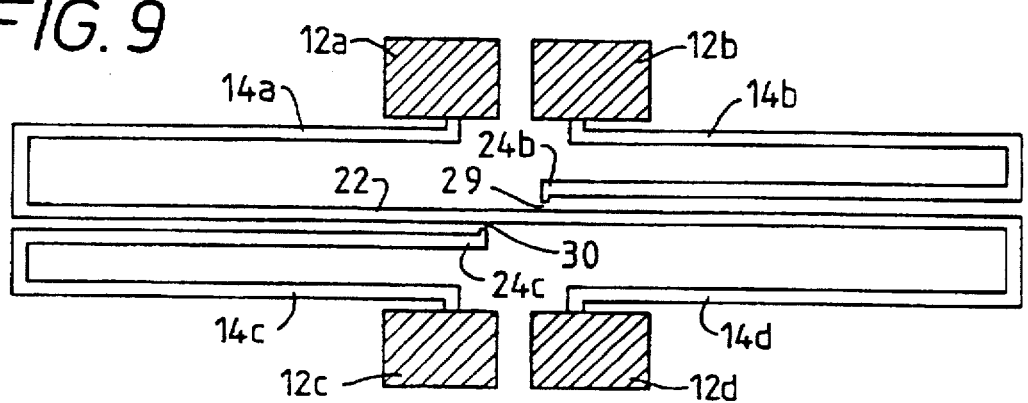
FIG. 9 is a diagrammatic plan view of a modified version of the sensor.

FIG. 9 shows a modified embodiment of the invention which can be considered as a modified version of FIG. 1 in which the sensing element 14c carries a sensing portion 24c in place of the sensing element 14a. The sensing element 14a is then integral with the sensing element 14d. This thus provides a reference beam 22 formed by the return legs of the sensing elements 14a,14d. Thus, an electric current can flow between the contacts 12a and 12d. Each sensing portion 24b,24c defines with the beam 22 a respective sensing gap 29,30. If a magnetic field is applied perpendicular to the plane of the paper and a current, e.g. of the order of mA, is passed through the beam 22, the long beam 22 is deflected by a Lorentz force in the plane of the paper. Detection is by making or breaking a tunnel contact across the sensing gap 29 or 30, and detecting the current at the support region 12b,12c. This current could be of the order of nA.

In the accompanying drawings, the sensing elements are shown, with sharp corners for the sake of diagrammatic simplicity. In practice, rounding of the corners in the suspended section improves the mechanical properties of the sensor.

The present invention can also be used to implement a plurality of sensors on a common substrate, one above another. That is, after forming a sensor as described herein, a further sensor could be manufactured atop the first sensor. For example, a sensor in one plane could have a sensing gap in the x direction while the sensor in the next plane could have a sensing gap in the y direction perpendicular to the x direction.

For the sake of completeness reference is also made to an article reviewing the state of the art in tunnelling sensors in 1988 entitled "Scanning tunnelling engineering" published in the Journal of Microscopy, Vol. 152, Pt. 2, November 1988, pages 585–596.

We claim:

1. A micromechanical sensor comprising a plurality of cantilever sensing elements supported on a substrate at respective support regions, a first set of said sensing elements having respective sensing portions and arranged to define a sensing gap there between and a second set of said sensing elements forming a counterpart set, the sensing elements being substantially similar one to another, and each sensing element comprising an outgoing elongate leg extending away from its respective support region and a return leg substantially parallel to the outgoing leg, extending towards the respective support region, each said outgoing elongate leg of said sensing elements of said first set having a first end fixed to said respective support region and a second longitudinal end remote therefrom each said return leg of said sensing elements of said first set having a first longitudinal end provided so as to be fixed with respect to and substantially continuous with said second longitudinal end of said outgoing elongate leg and a second, free end proximate said respective support region, said second, free end being free from attachment to another, supported structure.

2. A micromechanical sensor according to claim 1 wherein the support regions are arranged symmetrically on the substrate.

3. A micromechanical sensor according to claim 1 or 2 wherein the support regions are arranged in close proximity to one another and to the sensing gap.

4. A micromechanical sensor according to claim 1, wherein the first set of sensing elements comprises sensing elements supported by adjacent support regions, the return leg of each sensing element of said first set terminating at said second free end in said respective sensing portion and the sensing portions defining between them the sensing gap, and wherein the second set of sensing elements comprises sensing elements supported by adjacent support regions, the support regions supporting the sensing elements of the second set being arranged opposite the support regions supporting the sensing elements of the first set, whereby one of the second set of sensing elements acts as a control element to attract one of the sensing elements of the first set of sensing elements and thereby close the sensing gap.

5. A micromechanical sensor according to claim 4, wherein each said outgoing elongate leg of said sensing elements of said counterpart set having a first end fixed to said respective support region and a second longitudinal end remote therefrom, each said return leg of said sensing elements of said counterpart set having a first longitudinal end provided so as to be fixed with respect to and substantially continuous with said second longitudinal end of said outgoing elongate leg and a second, free end proximate said respective support region.

6. A micromechanical sensor according to claim 1, wherein one of the first set of sensing elements carries a proof mass.

7. A micromechanical sensor according to claim 1 wherein each leg of each sensing element includes a stepped region, the stepped regions being arranged so as to maintain the similarity of the sensing elements and lying in the plane of the sensing element.

8. A micromechanical sensor according to claim 1 wherein each sensing element comprises an insulating layer and a conductive layer over the insulating layer.

9. A micromechanical sensor according to claim 1 wherein the sensing portions are provided with at least one additional sensing layer particular to an analyte to be sensed.

10. A micromechanical sensor comprising a plurality of cantilever sensing elements supported on a substrate at respective support regions, a first set of said sensing elements having respective sensing portions and arranged to define a sensing gap and a second set of said sensing elements forming a counterpart set, the sensing elements being substantially similar one to another, and each sensing element comprising an outgoing elongate leg extending away from its respective support region and a return leg substantially parallel to the outgoing leg, extending towards the respective support region, each said outgoing elongate leg of said sensing elements of said first set having a first end fixed to said respective support region and a second longitudinal end remote therefrom each said return leg of said sensing elements of said first set having a first longitudinal end provided so as to be fixed with respect to and substantially continuous with said second longitudinal end of said outgoing elongate leg and a second, free end proximate said respective support region, said second, free end being free from attachment to another, supported structure, wherein the first set of sensing elements comprises sensing elements supported by regions diametrically opposed with respect to one another, the second, free ends of the return legs of the sensing elements of the first set carrying the sensing portions and wherein the counterpart sensing elements are supported by respective support regions also arranged diametrically opposed to one another and adjacent to the support regions supporting the sensing elements of the first set, the return legs of the sensing elements of the counterpart set being connected to one another to form a suspended beam, which acts as a reference element with which each sensing portion of said sensing elements of the first set defines a sensing gap.

* * * * *

UNITED STATES PATENT AND TRADEMARK OFFICE
CERTIFICATE OF CORRECTION

PATENT NO.   : 5,763,782                                    Page 1 of 1
DATED        : June 9, 1998
INVENTOR(S)  : David Frank Moore; Andrew Charles Frederick Hoole; Alan Heaver It is certified that error appears in the above-identified patent and that said Letters Patent is hereby corrected as shown below:

<u>Title page,</u>
Please change the Related U.S. Application Data to, -- [63] Continuation of Ser. No. 302,842, Dec. 26, 1994, abandoned, which was the national phase based on international application number PCT/GB93/00532, filed Mar. 15, 1993. --

Please change first paragraph of Column 1 to read, -- This is a continuation of application Ser. No. 08/302,842, filed Dec. 26, 1994, abandoned, which was the national phase based on international application number PCT/GB93/00532, filed Mar. 15, 1993. --

Signed and Sealed this

Fifth Day of February, 2002

Attest:

JAMES E. ROGAN
*Attesting Officer*          *Director of the United States Patent and Trademark Office*